(12) United States Patent
Herbert et al.

(10) Patent No.: US 6,683,294 B1
(45) Date of Patent: Jan. 27, 2004

(54) AVALANCHE PHOTO-DIODES

(75) Inventors: David C W Herbert, Malvern (GB); Edward T R Chidley, Tewkesbury (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/868,216

(22) PCT Filed: Dec. 17, 1999

(86) PCT No.: PCT/GB99/04306
§ 371 (c)(1),
(2), (4) Date: Jul. 24, 2001

(87) PCT Pub. No.: WO00/38248
PCT Pub. Date: Jun. 29, 2000

(30) Foreign Application Priority Data

Dec. 18, 1998 (GB) .............................................. 9827748

(51) Int. Cl.⁷ ................................................ H01J 40/14
(52) U.S. Cl. ................................ 250/214 R; 250/214.1
(58) Field of Search .......................... 250/214 R, 214.1, 250/214 LS; 327/514, 515, 530, 538; 257/290, 431–435

(56) References Cited

U.S. PATENT DOCUMENTS 5,578,815 A * 11/1996 Nakase et al. .......... 250/214 R

FOREIGN PATENT DOCUMENTS

| EP | 0 365 095 | 4/1990 |
| EP | 0 633 517 | 1/1995 |

OTHER PUBLICATIONS

Patent Abstracts of Japan vol. 011, No. 179 (E514), Jun. 1987 & JP62 010925 (Fujitsu Ltd), Jan. 1987.

Zappa F et al.: "Solid–State Single–Photon Detectors" Optical Engineering, US, Soc. of Photo–Optical Instrumentation Engineers, Bellingham, vol. 35, No. 4, Apr. 1996, pp. 938–945.

* cited by examiner

Primary Examiner—Que T. Le
(74) Attorney, Agent, or Firm—Nixon & Vanderhye P.C.

(57) ABSTRACT

The present invention provides an avalanche photo-diode detector arrangement comprising two avalanche photoiodes, which are each reverse biased to just below their breakdown voltage, are arranged back-to-back and are arranged in series with an oscillating voltage source such that the photodiodes exceed their breakdown voltage out of phase with each other. The oscillating voltage has a period of at least twice and preferably between 4 and 32 times, the avalanche zone transit time of the photo diodes. The detector arrangement achieves low noise and is able to distinguish dark counts.

19 Claims, 1 Drawing Sheet

AVALANCHE PHOTO-DIODES

Figure 1:
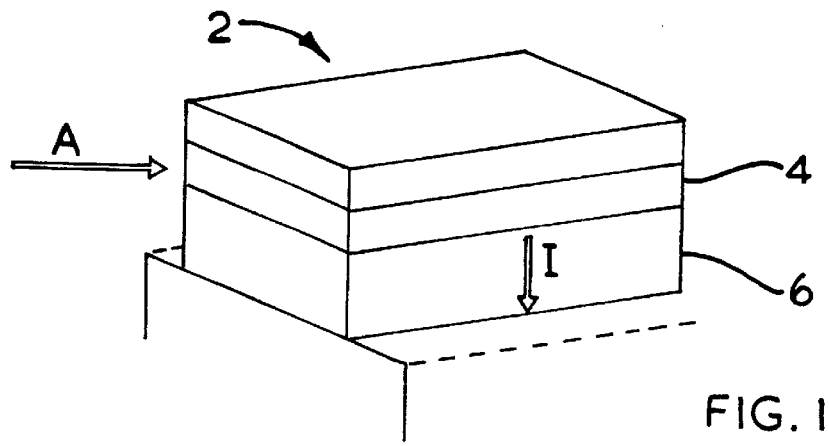

This application is the U.S. national phase of International Application Ser. No. PCT/GB99/04306, filed Dec. 17, 1999, which designated the U.S., the entire content of which is hereby incorporated by reference.

The present invention relates to semiconductor avalanche photo-diodes, and in particular to single photon avalanche diodes (SPADs).

Semiconductor avalanche photo-diodes are currently used in optical communications and for light detection in general. An avalanche photo-diode (APD) comprises a p-n structure which is operated under high reverse bias.

In some structures, light is absorbed within the avalanche region, but for long wavelength applications at eye safe wavelengths a separate absorption and multiplication (SAM) detector is often preferred. A photon detection region is sensitive to incident light to inject carriers into the conduction band of a depleted avalanche region of the photo-diode. The injected carriers traversing the avalanche region gain sufficient energy to enable further carriers to be excited across the energy gap between the valence and conduction bands by impact ionisation. This generates new carriers which themselves may generate further carriers by the same process. This process is known as avalanche multiplication of carriers and current gains in excess of 100 are readily obtainable.

A SPAD device is sensitive enough to detect a single incident photon of light. A single photon incident on the device will excite an electron from the valence band into the conduction band and the avalanche multiplication process will then generate a measurable pulse of current. However, SPAD detectors can generate pulses of current or dark counts which are not generated by an incident photon of light but are instead generated by the thermal release of a carrier from a trap in the semiconductor lattice. This necessitates the cooling of the SPAD device.

Furthermore, the avalanche multiplication process can be very noisy and this can compromise the performance of the SPAD detector by increasing jitter and reducing time resolution.

U.S. Pat. No. 3,453,436 discloses an avalanche photo-diode detector arrangement in which a photo-diode is biased to below its breakdown voltage and in which an oscillating voltage is applied to the photo-diode so that the photo-diode periodically exceeds its breakdown voltage. The frequency of the oscillating voltage is 200 kHz, which frequency is chosen so that the generation of microplasmas within the diode structure is supressed by ensuring that the voltage applied to the diode exceeds the threshold voltage for the generation of microplasmas for a period less than the period of time for activation of a microplasma.

The present invention aims to overcome at least some of the above mentioned problems by providing a avalanche photo-diode arrangement which can discriminate against dark counts and so relax the requirement for cooling of the photo-diode and/or which can reduce the noise of the avalanche multiplication process.

According to a first aspect of the present invention there is provided an avalanche photo-diode arrangement comprising;

at least two avalanche photo-diodes, which are each reverse biased to just below their breakdown voltage, and at least one oscillating voltage source arranged such that an oscillating voltage is applied to each photodiode so that each photo-diode exceeds its breakdown voltage periodically, wherein the or each oscillating voltage has a period greater than twice the avalanche zone transit time of the photo-diode to which it is applied.

By arranging a plurality of photo diodes in this way each diode will generate a current pulse in response to an incident light signal If the latter has a duration at least as long as one period of the voltage oscillation. For dark count rates which are low compared to the frequency of the oscillating voltage, a dark count event will generate a current pulse in only one of the detectors and in this way dark counts can be discriminated. Also, by arranging the oscillating voltage source to have a period greater than twice the avalanche zone transit time of the photo diodes, low noise operation of the photo-diodes can be achieved.

By choosing the period of oscillation P of the oscillating voltage to be in a preferred range of 4T to 32T, where T is the avalanche zone transit time of the associated photo-diode, it has been found that current pulses are generated with very low noise. For periods less than 4T, the probability of multiple pulses from dark counts becomes appreciable as the chance of carriers persisting in the diode from one cycle to the next starts to grow. For P>32T, simulations show that the avalanche noise levels start to rise. For example, at the optimum period of 4T, the excess avalanche noise factor is close to 2.6 and fairly insensitive to multiplication level (or voltage swing). For a period of 64T this has risen to, ≈18 and for longer periods the excess noise factors approach values available for DC biased diodes. For some applications it may be necessary to tolerate higher noise levels in order to achieve higher photocurrent. The period chosen for the oscillating voltage will in practice depend on the particular application. In general the shorter P gives the lowest excess avalanche noise and the longer P gives the higher photo current for a given amplitude of voltage oscillation.

The photo-diodes used in the arrangement may be made of group IV semiconductor materials, for example of a Silicon Germanium photon detection region and a Silicon avalanche region. Alternatively, the photo diodes used in the arrangement may be made of III–V semiconductor materials, for example of an Indium Gallium Arsenide photon detection region and a Indium Phosphide avalanche region.

Preferably, the photo diodes exceed their breakdown voltage out of phase with each other in order to generate a series of pulses In response to an incident light signal which can be discriminated from a single pulse which would be generated by a dark count event.

In an especially preferred embodiment two photo-diodes are used and are arranged back-to-back and in series with an oscillating voltage source. When a light signal is incident on the arrangement it will excite at least one electron from the valence band into the conduction band in both of the photo-iodes, however, avalanche multiplication will only occur in the photo-diode which is reverse biased above a threshold voltage.

When a light signal having a duration at least as long as the period of the oscillating voltage is incident on this preferred arrangement using two photo-iodes, it will generate a series of at least two pulses of current which are separated by half the period of the oscillating voltage. When the oscillating voltage is in its positive half cycle, the reverse bias voltage of a first one of the photo-diodes rises above its breakdown voltage and so can undergo avalanche multiplication to generate a first current pulse. At the same time the reverse bias voltage of a second of the photo-diodes falls further below its breakdown voltage and so cannot undergo avalanche multiplication. Then, when the oscillating voltage is in its negative half cycle, the reverse bias voltage of the second photo-diode rises above its breakdown voltage and will undergo avalanche multiplication to generate a second current pulse, delayed relative to the first by a time equal to half of the period of the oscillating voltage. At the same time the reverse bias voltage of the first photo diode falls further below its breakdown voltage and so cannot undergo avalanche multiplication.

If an incident light signal is incident on a photo-diode which is in its negative half cycle (ie. has a reverse bias voltage below the threshold), then the probability of detection in this diode is low. Consequently, in the preferred arrangement using two photo-diodes only 50% of the input signal is multiplied up. For most applications the extremely low noise levels achieved and the very high multiplication levels which become possible by using the arrangement according to the present invention, more than compensate for the loss of signal.

The total charge generated per photon will have extremely low noise levels making the arrangement according to the present invention ideal for use in fibre-optic communications to detect signals with bit rates approaching the oscillation frequency of the oscillating voltage. In fibre-optic communications the injection current generated by an incident light signal will in general be high relative to the injected current for a dark count event and so discrimination of dark count events is not such a big problem.

Discrimination against dark counts is, however, of very high interest for very low levels of incident light signals. In this case the signal duration must extend over at least one period of oscillation, so that both diodes generate at least one output pulse. The minimum number of photons which can be detected is therefore $\geq 2$.

Thus, the arrangement according to the present invention using two photo-diodes generates a minimum of two current pulses in response to an incident light signal which has a duration at least as long as a full cycle of voltage oscillation. Thus, an incident signal can be distinguished from a dark count event which will occur in only one of the photo-diodes and so will generate only one current pulse.

In this preferred embodiment the two photo-diodes are preferably substantially 180° C. degrees out of phase so that one of the diodes is "open" for detection at all times. Having the diodes 180° C. out of phase is also useful for minimising rf in the output of the photo-diode arrangement. Otherwise, the quantum efficiency of the arrangement would be reduced and compensating circuitry might be necessary to minimise the rf in the output of the arrangement. If the output rf from the oscillator circuitry is small compared to the photocurrent generated by the photo-detectors, then this is less of a problem. Further, in applications where a reduction in detection probability can be tolerated the diodes need not be exactly 180° C. out of phase.

It is preferred that the oscillator is a balanced oscillator and that the two photo-iodes are identical, so that the oscillator does not feed significant radio frequency (rf) current to the output of the arrangement. Alternatively, if the photo-diodes are not sufficiently close in rf impedance, then some tuning circuitry could be included for matching impedance of the photo-diodes and to minimise rf output from the arrangement.

In the preferred embodiment with two photo-diodes a light signal incident on the arrangement is preferably split into two, preferably equal, parts which parts are coupled to respective photo-diodes in the arrangement. This can be done by beam splitters or by using waveguide techniques.

A simplified arrangement is achieved when the two photo-diodes have the same structure.

According to a second aspect of the present invention there is provided a method of detecting incident light signals using an avalanche photo-diode arrangement comprising the steps of:

reverse biasing at least two photo-diodes to just below their breakdown voltage, applying an oscillating voltage to each of the photo-diodes such that each of the photo-diodes exceed their breakdown voltage periodically, wherein the or each oscillating voltage has a period which is greater than twice the avalanche zone transit time of the photo-diode to which it is applied.

Preferably, the photodiodes exceed their breakdown voltage out of phase with each other.

Preferably, the oscillating voltage has a period of between 4 and 32 times the avalanche zone transit time.

It is also preferred that the light incident on the arrangement has a duration of at least one period of the oscillating voltage.

In a preferred embodiment the arrangement comprises two photo-diodes which are arranged back-to-back and in series with one oscillating voltage source.

This latter preferred embodiments preferably comprises the additional steps of:

splitting an incident light signal into two, preferably equal parts, and coupling the two parts to a respective one of the photo-diodes so that the parts are incident on the photo-iodes in phase.

The present invention will now be described with reference to the following Figures in which:

FIG. 1 shows a schematic view of a single photon avalanche diode (SPAD) used in the arrangement according to the present invention.

Figure 2:
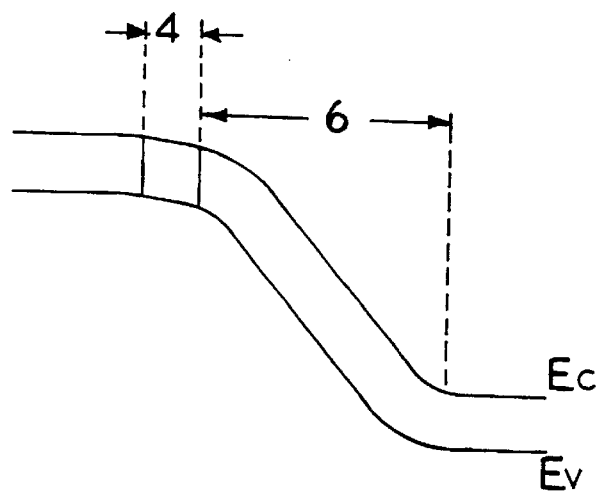

FIG. 2 schematically illustrates the variation in conduction band and valence band edge energies along the SPAD device of FIG. 1.

Figure 3:
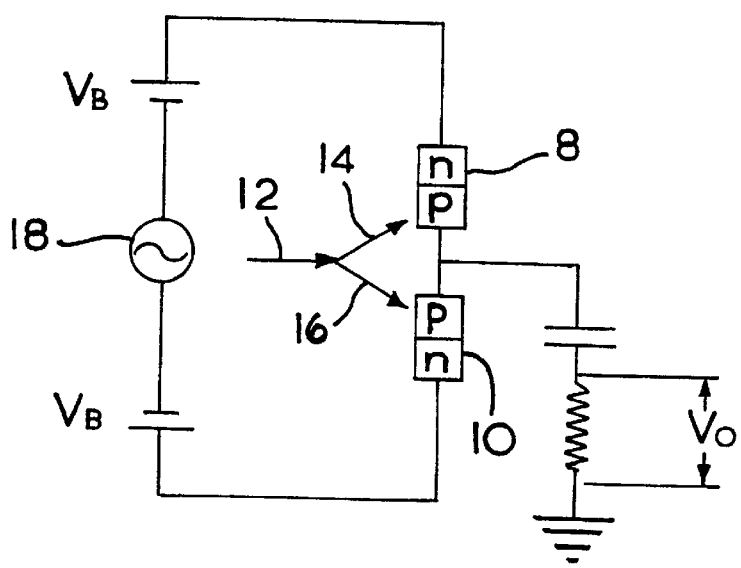

FIG. 3 shows an avalanche photo-diode circuit arrangement according to the present invention using two of the SPAD devices of FIG. 1.

Referring first to FIG. 1, the SPAD device (2) depicted schematically therein has the basic structure of a Silicon Germanium separate absorption and multiplication (SAM) avalanche photo-diode (APD) and accordingly comprises a multi-quantum well Silicon Germanium detection region (4) and a Silicon avalanche region (6). Light is coupled into the device (2) horizontally as indicated by arrow (A) in FIG. 1 in order to exploit the longer absorption length available in this geometry. Incident photons of light will excite electrons from the valence band of the detection region (4) into the conduction band. Current flows vertically as indicated by the arrow (I) and the avalanche multiplication process takes place in the avalanche region (6).

An alternative to the device (2) in FIG. 2 would be an indium Gallium Arsenide material system which has a strong optical absorption at wavelengths of 1.3 microns and 1.55 microns. In such a system, normal incidence detectors would normally be used.

Referring now to FIG. 2 which shows the variation in the conduction band edge energy $E_c$ and the valence band edge energy $E_v$ vertically across the SPAD device of FIG. 1. The multi-quantum well detection region (4) and the avalanche region (6) are shown.

Referring to the circuit arrangement of FIG. 3, two SPAD devices (8) and (10) of the type (2) shown in FIG. 1 are used.

The circuit is not specific to the type of SPAD detectors (2) shown in FIG. 1 and will work for other avalanche photo-diode devices. The incident light signal (represented schematically by arrow (12)) is split symmetrically into two beams (represented schematically by (14) and (16)) which are directed onto the SPAD devices (8) and (10) respectively. This splitting can be achieved optically with beam splitters. Alternatively, waveguide structures can be formed on a chip implementing the circuit of FIG. 3 in order to split the incident light signal, as is well known in the art.

The two SPAD devices (8) and (10) are connected back-to-back (ie. with their n-type regions, or in the case of FIG. 3 with their p-type regions connected) and each is subject to a dc reverse bias voltage $V_B$, which is just below the breakdown voltage of the devices (8,10). In addition each SPAD device (8) and (10) is subject to a series oscillating voltage $v_1 \cos(wt)$ generated by a balanced oscillating voltage source (18).

The balanced oscillator (18) has the property that as the voltage of device (8) is raised by dV, the voltage of the device (10) is reduced by dV and the potential between the devices (8,10) is unchanged if the impedances of the devices (8,10) are equal.

Because the oscillating voltage source (18) is in series with the devices (8) and (10) and because the devices (8) and (10) are back-to-back it can be seen that the devices (8) and (10) operate substantially 180° C. out of phase. Thus, as the voltage applied to one of the devices (eg. (8)) rises above the breakdown voltage the voltage applied to the other of the devices (eg. (10)) drops below the breakdown voltage. Thus, when only one of the SPAD devices (8) or (10) is able to generate a current pulse by avalanche multiplication, the other SPAD device is not able to generate a current pulse.

The period of oscillation of the oscillating voltage is chosen to equal between four and thirty two times the transit time of the avalanche region (6), ie. four to thirty two times the time taken for an electron to traverse the avalanche region.

A dark count output from the arrangement, will originate in one diode and will produce a current pulse with maximum duration $$S_{max} = T_d + P/2$$

where $T_d$ is the transit time of the device, and

P is the period of oscillation of the oscillating voltage source (18).

A genuine output from the arrangement, which is generated by an incident light signal, will have contributions from both diodes and will produce current with a minimum duration $$S_{min} = T_d + P.$$

For efficient operation the genuine output signal will extend for several periods P, which further increases the minimum time duration of a genuine output signal.

If a dark count is initiated while an incident light signal is being detected, then the detection process is unaffected. The minimum acceptable period of oscillation P, is determined by the requirement that a dark count initiates only one current pulse. The maximum acceptable period of oscillation P, is determined by the level of excess avalanche noise which can be tolerated, by the required time resolution for detection and by the time duration of incoming light signals.

For a 1 micron thick Silicon avalanche region (6) the transit time is of the order of $1 \times 10^{-11}$ seconds so for the oscillating voltage to have a period of four times the transit time, the frequency of the oscillating voltage will be of the order of 25 GHz. This period of oscillation reduces the excess noise associated with the avalanche multiplication processes in the SPAD devices (8) and (10) so that most of the noise in the SPAD devices (8) and (10) are due to the random time of injection, ie. the random time in the oscillating voltage cycle of the excitation of an electron by incident light from the valence into the conduction band. This low avalanche noise is maintained for high multiplication values of the SPAD devices (8) and (10).

For example, if a light signal is split equally so that light is incident on the SPAD devices (8) and (10) simultaneously, an electron will be excited into the conductance band of the detection regions (4) of both of the SPAD devices (8) and (10). If, for example the SPAD device (8) is above the breakdown voltage and device (10) is below the breakdown voltage when the light is incident, avalanche multiplication will be initiated immediately in the Silicon avalanche region of the SPAD device (8) to generate a first pulse of current. Then when the device (8) falls below the breakdown voltage and device (10) rises above the breakdown voltage, any electrons or holes remaining from the earlier excitation will initiate an avalanche and if the incident light signal extends over the entire period of oscillation of the voltage source, new carriers will be generated to initiate an avalanche in SPAD device (10) and a second delayed pulse of current will be generated.

These pulses of current are measured as sharp peaks in the output voltage $V_0$ of the circuit of FIG. 3. In the circuit of FIG. 3, the capacitor acts to block any DC current and is chosen to have low impedance at the frequency of operation of the arrangement in order to transmit the AC signal current.

A dark count will occur randomly in the SPAD devices (8) and (10) and so a dark count in the SPAD device (8) will occur independently of a dark count in the SPAD device (10). Thus, a dark count is unlikely to occur in both of the SPAD devices (8) and (10) simultaneously and so generally a dark count will generate only one current pulse and only one voltage peak will be measured at the output of the circuit in FIG. 3.

Thus, the circuit arrangement of FIG. 3 will generate at least two separated voltage peaks when light is incident on the devices (8) and (10) for a duration greater than the period of the oscillating voltage but will generally only generate a single voltage peak in response to a dark count event. Hence, in the vast majority of cases dark counts can be recognised and discarded from consideration.

The two SPAD devices (8) and (10) have equal impedance and so, when there is no incident light signal, the oscillation of the applied oscillating voltage $v_1 \cos(wt)$ will leave the potential between the diodes unchanged and so will not induce an output signal $V_0$ in the output component of the circuit of FIG. 3.

It is possible to vary the amplitude of the oscillating voltage, the period of the oscillating voltage and the avalanche zone thickness to optimise device performance. Also, the present invention can be applied to avalanche photo-diodes made of other group IV semiconductor materials and also to avalanche photo-diodes made of III-V semiconductor materials, such as indium Gallium Arsenide based avalanche photo-diodes.

The ideas invoked herein, although involving the expense of an oscillator circuit and a beam splitter, can provide reliable low noise and high bandwidth performance for avalanche photo-diodes.

What is claimed is:

1. An avalanche photo-diode detector arrangement comprising at least two avalanche photo-diodes, which are each reverse biased to just below their breakdown voltage and at least one oscillating voltage source arranged such that an oscillating voltage is applied to each photo-diode so that each photo-diode exceeds its breakdown voltage periodically, wherein the or each oscillating voltage has a period which is greater than twice the avalanche zone transit time of the photo diode to which it is applied.

2. An arrangement according to claim 1 wherein the photo-diodes exceed their breakdown voltage out of phase with each other.

3. An arrangement according to claim 2 wherein there are two photo-diodes which are arranged back-to-back and in series with an oscillating voltage source.

4. An arrangement according to claim 1 wherein the oscillating voltage has a period of between 4 and 32 times the avalanche zone transit time.

5. An arrangement according to claim 3 when dependent on claim 3 wherein a light signal incident on the arrangement is split into two parts which parts are coupled to respective photo-diodes.

6. An arrangement according to claim 1 wherein a light signal incident on the arrangement has a duration at least as long as the period of oscillation of the voltage source.

7. An arrangement according to claim 1 wherein the photo-diodes have the same structure.

8. An arrangement according to claim 1 wherein the photo-diodes are made of group IV semiconductor materials.

9. An arrangement according to claim 8 wherein the photo-diodes have a Silicon Germanium photon detection region and a Silicon avalanche region.

10. An arrangement according to claim 1 wherein the photo diodes are made of III–V semiconductor materials.

11. An arrangement according to claim 10 wherein the photo-diodes have an Indium Gallium Arsenide photon detection region and an Indium Phosphide avalanche region.

12. An arrangement according to claim 1 wherein the oscillating voltage applied to each photo-diode has the same period.

13. A method of operating an avalanche photo-diode detector arrangement comprising the steps of:

reverse biasing at least two photo diodes to just below their breakdown voltage, applying an oscillating voltage to each of the photo diodes such that each photo-diode exceeds its breakdown voltage periodically, wherein the or each oscillating voltage has a period which is greater than twice the avalanche zone transit time of the photo diode to which it is applied.

14. A method according to claim 13 wherein the photo-diodes exceed their breakdown voltage out of phase with each other.

15. A method according to claim 14 wherein the arrangement comprises two photo-diodes which are arranged back-to-back and in series with an oscillating voltage source.

16. A method according to claim 12 wherein the oscillating voltage has a period of between 4 and 32 times the avalanche zone transit time.

17. A method according to claim 15, comprising the additional steps of:

splitting an incident light signal into two parts, and coupling the two parts to a respective one of the photo-diodes so that the parts are incident on the photo-diodes in phase.

18. A method according to claim 1 wherein an incident light signal has a duration of at least the period of oscillation of the oscillating voltage.

19. A method according to claim 1 wherein the oscillating voltage applied to each photo-diode has the same period.

* * * * *